US009329615B2

(12) United States Patent
Neidorff

(10) Patent No.: US 9,329,615 B2
(45) Date of Patent: May 3, 2016

(54) TRIMMED THERMAL SENSING

(75) Inventor: Robert Alan Neidorff, Bedford, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 877 days.

(21) Appl. No.: 12/758,396

(22) Filed: Apr. 12, 2010

(65) Prior Publication Data

US 2011/0248772 A1 Oct. 13, 2011

(51) Int. Cl.

| | |
|---|---|
| ***H01L 35/00*** | (2006.01) |
| ***H01L 37/00*** | (2006.01) |
| ***H03K 3/42*** | (2006.01) |
| ***H03K 17/78*** | (2006.01) |
| ***G05F 3/30*** | (2006.01) |

(52) U.S. Cl.

CPC .......................................... *G05F 3/30* (2013.01)

(58) Field of Classification Search

CPC ......... G01K 7/01; G01K 3/005; G01K 7/015; G05F 3/30; H01L 23/34

USPC .......................................... 327/512–513, 539

See application file for complete search history.

(56) References Cited

U.S. PATENT DOCUMENTS

| | | | | |
|---|---|---|---|---|
| 5,448,174 A | | 9/1995 | Gose et al. | |
| 5,980,106 A | * | 11/1999 | Yamamoto et al. | 374/178 |
| 6,816,351 B1 | | 11/2004 | Frank et al. | |
| 6,847,254 B2 | * | 1/2005 | Pai | 327/572 |
| 7,197,420 B2 | * | 3/2007 | Johns et al. | 702/130 |
| 7,301,389 B2 | * | 11/2007 | Coady | 327/539 |
| 7,482,797 B2 | | 1/2009 | Cave | |
| 7,728,575 B1 | * | 6/2010 | Ozalevli et al. | 323/313 |
| 2005/0077952 A1 | * | 4/2005 | Okada | 327/539 |
| 2005/0276140 A1 | * | 12/2005 | Ogiwara et al. | 365/212 |
| 2006/0044047 A1 | * | 3/2006 | Porter | 327/512 |
| 2007/0216468 A1 | * | 9/2007 | Duarte | 327/513 |
| 2009/0002057 A1 | | 1/2009 | Hwang | |

OTHER PUBLICATIONS

Sadeghi, Vahideh Sadat and Naimi, Hossein Miar, "A Modified Method for Compensating the Base-Emitter Voltage Used in Bandgap References", IJCSNS International Journal of Computer Science and Network Security, vol. 9 No. 4, Apr. 2009, pp. 117-122.

Article "Power Management Design Line", International IOR Rectifier—The Power Management Leader, Oct. 18, 2006, 5 pages.

Pease, Bob, "The Design of Band-Gap Reference Circuits: Trials and Tribulations", National Semiconductor, retrieved on Jan. 27, 2010, from http://www.national.com/rap/Application/1,1570,24,00.html, 4 pages.

* cited by examiner

*Primary Examiner* — Quan Tra

(74) *Attorney, Agent, or Firm* — William B. Kempler; Frank D. Cimino

(57) ABSTRACT

A trimmed thermal sensing system can include a temperature sensitive circuit configured to provide an output that varies as a function of temperature and in response to a trimmed bandgap reference signal. A trim network is coupled to the temperature sensitive circuit. The trim network trims the temperature sensitive circuit in an opposite direction of trimming implemented to provide the trimmed bandgap reference signal, such that temperature tolerance of the temperature sensitive circuit is reduced.

18 Claims, 2 Drawing Sheets

TRIMMED THERMAL SENSING

BACKGROUND

Various types of thermometers or temperatures sensors have been designed to measure temperature, such as for use in a wide variety of scientific and engineering applications, especially measurement systems. One type of temperature sensor that can be included in an integrated circuit (IC) is the silicon bandgap temperature sensor. One main advantage of the silicon bandgap temperature sensor is that it can be included in a silicon IC at low cost. While a silicon bandgap temperature sensor can generate a voltage or current that is proportional to absolute temperature, the circuitry that detects this voltage or current often experiences inaccuracies or variations over temperature. These inaccuracies can be increased due to process variations.

SUMMARY

One aspect of the invention provides a trimmed thermal sensing system that includes a temperature sensitive circuit configured to provide an output that varies as a function of temperature and in response to a trimmed bandgap reference signal. A trim network is configured to trim the temperature sensitive circuit in an opposite direction of trimming implemented to provide the trimmed bandgap reference signal, such that temperature tolerance of the temperature sensitive circuit is reduced.

Another aspect of the invention provides an integrated circuit that includes a bandgap generator configured to provide a bandgap reference signal. A first trim network is configured for trimming the bandgap generator to provide a trimmed bandgap reference signal. The integrated circuit also includes a thermal shutdown circuit that includes a transistor having a base-emitter voltage that varies as a function of temperature thereof. The thermal shutdown circuit is configured to provide a thermal shutdown signal that indicates whether the temperature of the integrated circuit exceeds a predetermined temperature. A second trim network is coupled to the thermal shutdown circuit and configured for trimming the thermal shutdown circuit based on the trimming of bandgap generator, whereby temperature tolerance of the thermal shutdown circuit is reduced.

Yet another aspect of the invention provides a method for reducing temperature tolerance of a temperature sensitive circuit. The method includes trimming a bandgap generator in a first direction such that the bandgap generator provides a trimmed bandgap reference signal. Temperature sensitive circuitry is trimmed based on the trimming of the bandgap generator and in a second direction that is opposite of the first direction.

DETAILED DESCRIPTION

The invention relates to a system and method for trimmed thermal sensing. The systems and methods can be utilized to trim temperature sensitive circuitry based on bandgap trim information so as to reduce tolerance to temperature variations. Such temperature sensitive circuitry can be configured (e.g., as a thermometer or thermal shutdown circuitry) to provide an output that varies as a function of temperature in response to a trimmed bandgap reference signal. A trim network (e.g., one or more switched or adjustable resistors) can be coupled to the temperature sensitive circuitry and trimmed in a direction that is opposite the direction of trimming performed on bandgap circuitry that is utilized to provide the trimmed bandgap reference signal. As a result of the trimming of the temperature sensitive circuitry, the temperature tolerance of the temperature sensitive circuitry is mitigated.

For example, the temperature sensitive circuitry includes one or more transistors having a voltage across a base-emitter junction ($V_{BE}$) that varies as a function of temperature, such as a function of KT/q, where K is Boltzmann's constant, T is temperature in Kelvin and q is the charge of an electron. Since the bandgap reference signal has been trimmed to compensate for similar variations in the $V_{BE}$ of associated circuitry, by trimming the temperature sensitive circuitry in an opposite direction, the $V_{BE}$ variation for the temperature sensitive circuitry can be mitigated. That is, since the base emitter voltage $V_{BE}$ is utilized as part of the thermal sensitive circuitry for sensing or shutdown purposes, such temperature sensitive circuitry would, in the absence of such trimming thereof, still be responsive to variations in $V_{BE}$. The adverse effect due to the variation in $V_{BE}$ can seem more pronounced when reference signals have been derived from a trimmed bandgap reference. Even if the trim implemented for the thermal sensitive circuitry is imperfect (e.g., by employing a different magnitude of trimming than the bandgap trimming), the accuracy of the thermal sensitive circuitry will be improved.

As used herein, the term "direction" in the context of trimming refers to the direction that a reference (e.g., a bandgap voltage or current reference) changes in response to the trimming. For instance, trimming can be applied to increase a reference voltage from an untrimmed voltage level in the absence of trimming, such that the trimming of a second voltage in the opposite direction would results in a decrease in such second voltage. The magnitude of change in each'respective voltage in their respective directions can be the same or different.

Figure 1:
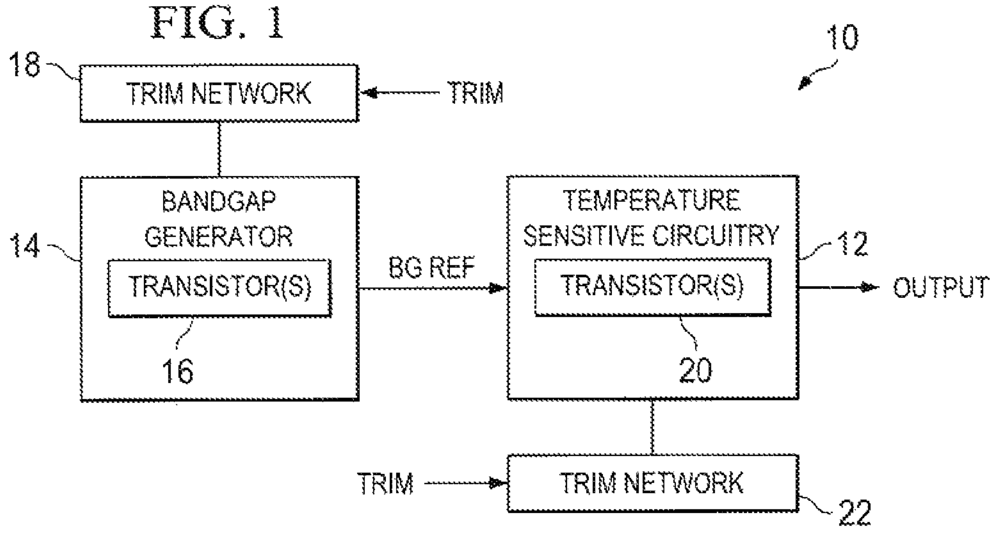
FIG. 1 is a block diagram depicting an example of a trimmed thermal sensing system according to an aspect of the invention.

FIG. 1 depicts an example of a trimmed thermal sensing system 10 that can be implemented according to an aspect of the invention. The system 10 includes temperature sensitive circuitry 12 that is configured to provide an output that varies a function of temperature. For example, the temperature sensitive circuitry 12 can be implemented as a thermometer or a thermal shutdown circuit of an integrated circuit chip. The temperature sensitive circuitry 12 provides the output signal in response to a bandgap reference signal (BG REF).

A bandgap generator 14 can provide the BG REF signal as a voltage or current reference signal. Those skilled in the art will understand various types of circuits that can be implemented as the bandgap generator 14. For example, the bandgap generator 14 can be implemented as a Brokaw bandgap reference circuit that includes two transistors (e.g., bipolar junction transistors (BJTs)) 16. The transistors 16 are configured in an arrangement to provide the bandgap reference signal BG REF as a signal that varies based at least in part from the base emitter voltage $V_{BE}$ from a pair of BJTs. The bandgap generator 14 can employ a trim network 18 to trim the bandgap generator 14 to maintain a substantially constant bandgap reference over a range of temperatures. Once trimmed, the bandgap generator 14 can provide the bandgap reference signal BG REF. For instance, the trimmed bandgap generator 14 can provide the bandgap reference signal BG REF as a voltage that is proportional to absolute temperature or a current that is proportional to absolute temperature. Alternatively, the trimmed bandgap generator 14 can provide the bandgap reference signal BG REF as fixed voltage or current, which can be equal to or derived from a bandgap voltage reference, and which remains constant over temperature.

The system includes another trim network 22 for trimming the temperature sensitive circuitry based on the trimming implemented by the trim network 18 for the bandgap generator 14. The trim network 22 can be coupled to or form part of the temperature sensitive circuitry 12. The trim network 22 is configured for trimming the temperature sensitive circuitry 12 in the opposite direction from trimming implemented by the trim network 18 so that variations in the base emitter voltage ($V_{BE}$) of one or more transistors 20 are mitigated to thereby reduce temperature tolerance for the temperature sensitive circuitry 12.

As an example, if the trim network 18 has been configured to trim a respective bandgap reference voltage up by a first magnitude and in a first direction, then the trim network 22 can be configured to trim a voltage associated with the one or more transistor 20 of the temperature sensitive circuitry in the opposite direction by a second magnitude. In this example, the value of the first magnitude and the second magnitude that each of the reference voltages are trimmed can be generally equal, although a different second magnitude can still result in an increased tolerance to temperature variations than in the absence of such trimming. This is because the trim network 18 trims circuitry to provide a bandgap reference that remains constant over temperature and from which the bandgap reference signal BG REF is provided, whereas a voltage associated with the transistor(s) 20 of the temperature sensitive circuitry 12 operates complementary to the absolute temperature due to the negative thermal coefficient of the $V_{BE}$ of the transistor(s). The trim network 22 thus is utilized for trimming that compensates for the process variation of the temperature sensitive circuitry 12, such that the trimming can be considered complementary (e.g., in the opposite direction) relative to the trimming implemented by the trim network 18 on the bandgap generator 14.

Figure 2:
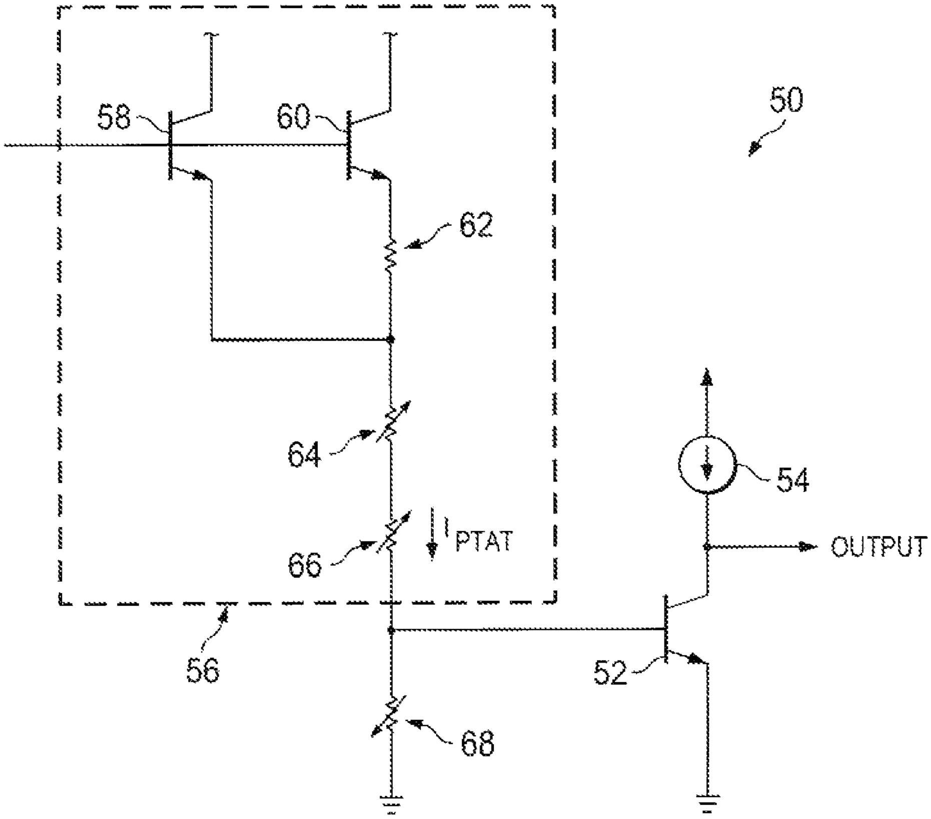
FIG. 2 depicts an example of a circuit diagram for a trimmed thermal sensing system according to another aspect of the invention.

FIG. 2 depicts an example of a circuit diagram for a thermal shutdown circuit 50. The thermal shutdown circuit 50 includes a transistor 52 connected between a current source 54 and electrical ground. The base of the transistor 52 is connected to receive a reference signal that is proportional to absolute temperature. For instance, the voltage at the base can be derived as a function of a current signal that is proportional to absolute temperature, indicated at $I_{PTAT}$. The current $I_{PTAT}$ is provided based on a trimmed bandgap reference signal provided by associated circuitry 56, such as corresponding to a bandgap reference generator.

In the example of FIG. 2, the circuitry 56 includes a pair of transistors 58 and 60 having a common base and configured to provide the reference current $I_{PTAT}$ based upon an arrangement of resistors 62, 64, 66 and 68. The resistors 62, 64, 66 and 68 are configured to provide the $I_{PTAT}$ current as a trimmed bandgap reference. For example, each of the resistors 64 and 66 can be trimmed to compensate for $V_{BE}$ variation such that the common base voltage is substantially constant over a desired temperature range. Such trimming of the circuitry 56 to produce the corresponding trimmed $I_{PTAT}$ current is well known. For instance, such trimming can be performed as part of the fabrication or packaging process to establish one or more trimmed bandgap reference signal.

Trim resistor 68 is coupled between the base of transistor 52 and ground as part of the thermal shutdown circuitry. The trim resistor 68 provides a path for the $I_{PTAT}$ current to flow. The resistor 68 can be configured to set a voltage for operating the transistor 52 of the thermal shutdown circuit 50 in response to the $I_{PTAT}$ current. That is, the resistor 68 can be designed to set a desired temperature threshold for activating the transistor 52 based on the current $I_{PTAT}$. However, since the base-emitter voltage $V_{BE}$ of the transistor 52 exhibits a complimentary voltage that varies as a function of temperature, the resistor 68 is trimmed to mitigate the effects of the $V_{BE}$ variations. The trimming with resistor 68 can be implemented in the opposite direction of trimming with the resistors 64 and 66 to mitigate the temperature tolerance of the transistor 52. The trimming of the resistor 68 can be implemented in an opposite direction and of substantially equal magnitude of trimming implemented by the resistor 64 and 66. It will be appreciated that the temperature tolerance of the transistor 52 (and the operation of the thermal shutdown circuit 50 in general) can be reduced by trimming in the opposite direction via the resistor 68 even if the trimming is not of equal magnitude when compared to the trimming applied to the circuitry 56. It will be understood and appreciated that the current source 54 can be generated based upon the $I_{PTAT}$ current or by another current source unrelated to the bandgap reference.

Figure 3:
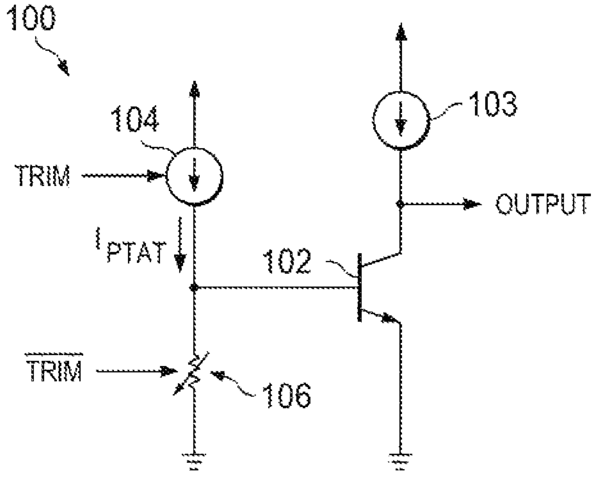
FIG. 3 depicts an example of a trimmed thermal sensing system that can be implemented according to another aspect of the invention.

FIG. 3 depicts another representation of a trimmed temperature sensitive circuit 100 that can be implemented according to an aspect of the invention. In the circuitry 100, a transistor (e.g., a BJT) 102 is connected between a current source 103 and ground. Another current source 104 is trimmed in a first direction by a trimming signal (indicated at TRIM in FIG. 3) as to provide a current that is proportional to absolute temperature, indicated at $I_{PTAT}$. The current $I_{PTAT}$ corresponds to a bandgap reference signal. The $I_{PTAT}$ current can be substantially linear with respect to the temperature of the IC implementing the circuit 100 based on the trimming thereof. For instance, the current $I_{PTAT}$ can be generated by a trimmed bandgap circuit or it can be derived from a trimmed bandgap voltage reference, such as through a current mirror.

A trim resistor 106 is connected between the base of transistor 102 and ground. The resistor 106 is configured to set the threshold for operating the circuit 100 based on the $I_{PTAT}$, which is known a priori. The resistor 106 is further trimmed by a trim signal (indicated at $\overline{\text{TRIM}}$) in a direction and magnitude that is substantially opposite of the trimming utilized for the bandgap reference (not shown). For instance, the reference can be trimmed up 10 mV to compensate for transistors with $V_{BE}$ that is 10 mV lower. As a result, the threshold voltage for triggering the transistor 102 can be decreased by about 10 mV by decreasing the resistance of the resistor 106 accordingly.

Figure 4:
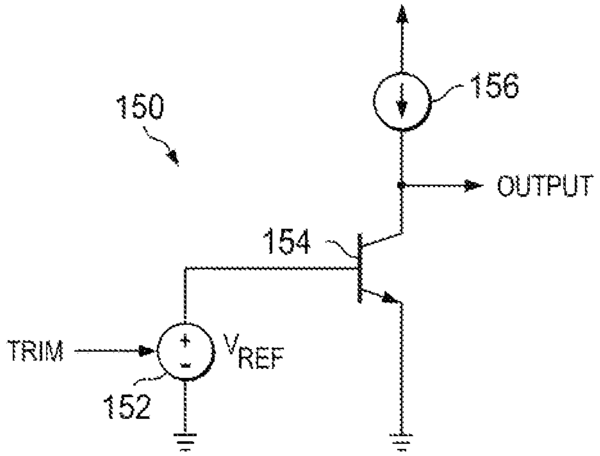
FIG. 4 depicts yet another example of a trimmed thermal sensing system that can be implemented according to an aspect of the invention.

FIG. 4 depicts an example of a thermal shutdown circuit 150 that is configured to operate in response to a fixed voltage source 152. In the example of FIG. 4, the transistor 154 is connected between a current source 156 and ground. A base of the transistor 154 is connected to receive a fixed DC reference voltage ($V_{REF}$) from the voltage source 152. The fixed voltage reference $V_{REF}$ is generated as a bandgap voltage reference or derived from a bandgap voltage reference and thus remains constant over temperature. For example, a bandgap generator (not shown) can be configured and trimmed to generate a bandgap reference voltage (e.g., about 1.2 V) that remains constant over temperature variations. A voltage divider (or other circuitry), corresponding to the voltage source 152, can be configured to provide the $V_{REF}$ as a desired bias voltage at the base of the transistor 154.

As mentioned above, the base-emitter voltage $V_{BE}$ of the transistor 154 for biasing the transistor varies as a function of temperature, which can further vary between different integrated circuits due to process variations. It is this variation of the $V_{BE}$ of the transistor 154 that utilized (at least in part) to set the threshold of the thermal shutdown circuit 150. That is, since the amount that $V_{BE}$ of the transistor 154 varies is further dependent on process variation of the IC implementing the thermal shutdown circuit 150, the accuracy of the thermal shutdown circuit is increased by further trimming of the voltage source 152. The trimming that is utilized to provide the fixed bandgap reference voltage $V_{REF}$ is in the opposite direction of trimming that is implemented to provide the bandgap voltage from which the reference voltage $V_{REF}$ is derived. To compensate for such variations and increase accuracy of the thermal shutdown circuit 150, the information from trimming of the bandgap reference is utilized to trim the voltage source 152 in an opposite direction. Such trimming (indicated at TRIM in FIG. 4) thus sets a desired threshold that affords increased accuracy and reduced temperature tolerance.

Figure 5:
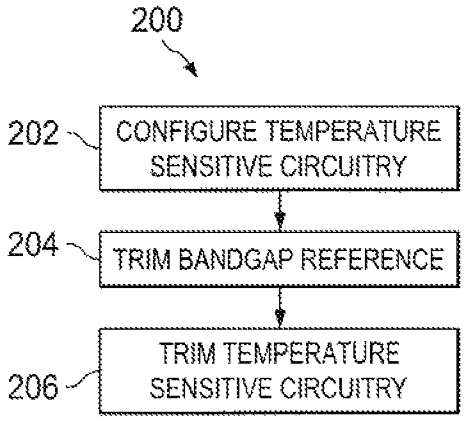
FIG. 5 is a flow diagram depicting a method for trimming temperature sensitive circuitry according to an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method. It is to be further understood that the following methodologies can be, implemented in variety of different manners (e.g., laser trimming, burn-in or the like), which may include one or more automated or other processes. As one example, a processor can execute instructions stored in memory to control switches to adjust resistance values for implementing trimming of each of a bandgap reference and temperature sensitive circuitry, such as shown and described herein (see, e.g., FIGS. 1-4). Such control can be implemented to trim the bandgap reference and the temperatures sensitive circuitry concurrently.

FIG. 5 depicts an example of a method 200 that can be utilized to configure temperature sensitive circuitry for improved operation. The method of FIG. 5 can be utilized in the context of temperature sensitive circuitry that operates based on bandgap reference signal. For example, the temperature sensitive circuitry can receive an input signal that is derived from a trimmed bandgap reference, such as a current or voltage that is proportional to absolute temperature. As another example, the temperature sensitive circuitry can receive a fixed or DC signal, such as corresponding to or derived from a trimmed bandgap reference signal.

The method 200 begins at 202 in which the temperature sensitive circuitry is configured. The configuring of the temperature sensitive circuitry can include setting one or more resistors or other circuitry to be responsive to temperature. For the example of a thermal shutdown circuit, the configuration at 202 can include setting a resistor to establish a voltage threshold for triggering an output indicative of a thermal shutdown condition. For instance, if the temperature of the integrated circuit rises above a threshold, the voltage across such resistor can have a voltage set to activate a corresponding transistor. Alternatively, a bandgap reference can be set to provide a fixed threshold.

At 204, a bandgap reference is trimmed. For instance, a corresponding bandgap reference generator can be trimmed up, such as to compensate for a low output which would result in a negative temperature coefficient associated with the reference that is being generated. The trimmed bandgap reference can be utilized as an input signal or used to derive the input signal that is provided to the temperature sensitive circuitry.

At 206, the temperature sensitive circuitry is trimmed. For example, a resistor that is utilized to set a threshold for the temperature sensitive circuitry can be trimmed in an opposite direction as the trimming utilized at 204, such as to reduce sensitivity of a process variation of one or more transistor in the temperature sensitive circuitry. The trimming at 206 can be performed concurrently with the trimming at 204, which can be a trimming process for the corresponding integrated circuit or die containing the bandgap reference generator and the temperature sensitive circuitry. As a further example, trimming information from the trimming of the bandgap reference at 204 thus can be utilized to trim the temperature sensitive circuitry, such that the trimming can be in the opposite directions but substantially equal magnitudes.

Those skilled in the art will appreciate, however, that the even if the trimming of the temperature sensitive circuitry is different in magnitude from the trimming at 204, the trimming can still result in improved thermal accuracy. Thus, by utilizing trimming at 204, which will usually be done for reasons independent of the trimming at 206, the information from the trimming at 204 provides an efficient mechanism to increase thermal accuracy of temperature sensitive circuitry that would otherwise either be expensive to trim or have been omitted altogether due to the increase cost by conventional approaches.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A trimmed thermal sensing system comprising:

a temperature sensing circuit configured to provide an output that varies as a function of temperature and in response to a bandgap reference signal generated by a bandgap reference circuit that is trimmed by a first amount to compensate for Vbe variation; and a trim network linked to the trimmed bandgap reference and configured to always trim the temperature sensing circuit dependent on the bandgap trimming and by a an amount substantially equal to the first amount but in an opposite direction of trimming implemented to provide the trimmed bandgap reference signal, whereby temperature calibration of the temperature sensing circuit is automatically provided.

2. The system of claim 1, wherein the trim network is a first trim network, the system further comprising:

a second trim network configured to trim the bandgap generator as to provide the trimmed bandgap reference signal.

3. The system of claim 1, wherein the trim network comprises a variable resistance.

4. The system of claim 3, wherein the temperature sensing circuit comprises a temperature sensor, a voltage across the variable resistance being proportional to temperature.

5. The system of claim 4, wherein the temperature sensor comprises a thermal shutdown circuit, the thermal shutdown circuit comprising:

a bipolar transistor having a base, the voltage across the variable resistance being provided to the base of the transistor to control the transistor accordingly, the variable resistance being adjusted to trim the thermal shutdown circuit in the opposite direction of trimming implemented to provide the trimmed bandgap reference signal.

6. The system of claim 5, further comprising a current source that is configured to provide current proportional to absolute temperature to the variable resistance based on the bandgap reference signal.

7. The system of claim 5 implemented on an integrated circuit.

8. The system of claim 1, wherein the temperature sensing circuit comprises a transistor having a base-emitter voltage that varies as a function of temperature, the output of the temperature sensing circuit corresponds to a signal that indicates whether the temperature exceeds a predetermined temperature threshold; and the system further comprising a voltage source configured to provide a predetermined DC voltage to the base of the transistor based on the trimmed bandgap reference signal, the trim network being trimmed to drive the transistor with reduced temperature tolerance.

9. An integrated circuit comprising:

a bandgap generator configured to provide a bandgap reference signal; and a first trim network configured for trimming the bandgap generator for Vbe variation by a first amount to provide a trimmed bandgap reference signal at substantially a predetermined voltage;

a temperature detection circuit comprising:

a transistor having a base-emitter voltage that varies as a function of temperature thereof, a collector of the transistor being coupled to provide a temperature detection signal that indicates whether the temperature of the integrated circuit exceeds a predetermined temperature; and a second trim network coupled to the temperature detection circuit and linked to and dependent on the first trim network and being configured for trimming the temperature detection circuit by substantially the first amount always in a direction opposite from the trimming of the bandgap generator, whereby temperature calibration of the temperature detection circuit is automatically provided.

10. The system of claim 9, wherein the first trim network trims the bandgap generator in a first direction and the second trim network trims the temperature detection circuit in a second direction that is opposite the first direction.

11. The system of claim 9, further comprising a current source that is configured to provide current proportional to absolute temperature based on the bandgap reference signal.

12. The system of claim 11, wherein the second trim network comprises a variable resistance coupled between the current source and ground to provide a voltage at the base of the transistor that varies as a function of temperature, the variable resistance being adjusted to trim the temperature detection circuit in the opposite direction of the trimming implemented to provide the trimmed bandgap reference signal.

13. The system of claim 9, further comprising a voltage source that is configured to provide a predetermined DC voltage to the base of the transistor based on the trimmed bandgap reference signal, the second trim network trimming the voltage source in an opposite direction of the trimming utilized to provide the trimmed bandgap reference signal, whereby the transistor is operated with reduced temperature tolerance.

14. A method for reducing temperature tolerance of a temperature sensing circuit, the method comprising:

measuring an output voltage of a bandgap generator;

trimming the bandgap generator to compensate for Vbe variation in a first direction by a first amount such that the bandgap generator provides a trimmed bandgap reference signal that corresponds substantially to a predetermined value;

linking the trimming of the to trimming temperature sensing circuitry so that is dependent on the trimming of the bandgap generator; and trimming the temperature sensing circuitry by substantially the first amount as the trimming of the bandgap generator and always in a second direction that is opposite of the first direction, whereby the temperature sensing circuitry is automatically calibrated.

15. The method of claim 14, wherein the temperature sensing circuitry is driven with an input signal that is based on the trimmed bandgap reference signal.

16. The method of claim 14, wherein the bandgap generator and the temperature sensing circuitry reside on a common integrated circuit.

17. The method of claim 16, wherein the temperature sensing circuitry comprises a thermometer configured to provide an output signal that indicates a temperature of the integrated circuit, the trimming of the temperature sensing circuitry reducing the temperature tolerance of the thermometer.

18. The method of claim 14, wherein the temperature sensing circuitry comprises a thermal shutdown circuit configured to provide an output signal that indicates whether a temperature of the integrated circuit has exceeded a predetermined temperature, the trimming of the temperature sensing circuitry reducing a temperature tolerance of the thermal shutdown circuit.

* * * * *